PROCESS FOR MAKING OHMIC CONTACT TO PLANAR GERMANIUM SEMICONDUCTOR DEVICES
Filed June 2, 1965

INVENTOR:
DONALD P. SANDERS

E. Mickey Hubbard
ATTORNEY

United States Patent Office 3,523,038

Patented Aug. 4, 1970

3,523,038

PROCESS FOR MAKING OHMIC CONTACT TO PLANAR GERMANIUM SEMICONDUCTOR DEVICES

Donald P. Sanders, Richardson, Tex., assignor to Texas Instruments Incorporated, Dallas, Tex., a corporation of Delaware Filed June 2, 1965, Ser. No. 460,727
Int. Cl. H05k *1/02, 3/02, 2/04*
U.S. Cl. 117—212 4 Claims

ABSTRACT OF THE DISCLOSURE

Disclosed is a method of electrolessly depositing a layer of metal onto the surface of a semiconductor substrate exposed by an opening in an insulating layer on the substrate surface without depositing metal on the insulating layer itself.

Figure 1:
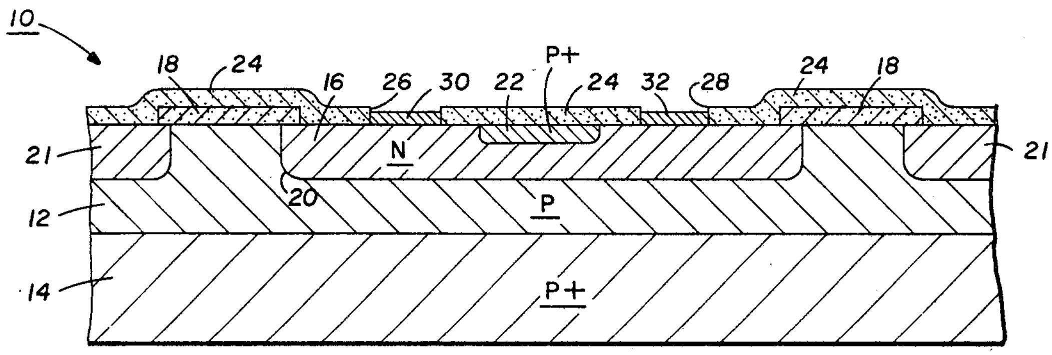

This invention relates generally to semiconductor devices, and more particularly, but not by way of limitation, relates to an improved process for applying expanded metallized contacts to germanium devices having a planar configuration, and to the article of manufacture resulting therefrom.

One process heretofore used for making contact to the base region of a planar germanium transistor entails depositing a suitably doped alloy, such as silver-gold-antimony, gold-antimony, or silver antimony, over the surface of the photo-resist film used to selectively open the base contact windows in the silicon oxide layer. The metal layer is then patterned by suitable photolithographic mask and etch techniques to remove the excess alloy material and leave the alloy only in the contact openings. After the photolithographic masking material has been stripped from the metal film that remains in the openings and from the oxide layer, the metal film and base region are alloyed to produce, upon recrystallization, a heavily doped region to which aluminum or other expanded contact material can be applied.

In the above described process, which is more universally employed, it will be noted that a vacuum chamber and associated vapor deposition equipment is required to deposit the alloy film, and separate photolithographic masking and etching equipment is required in addition to that required to deposit and pattern the film which forms the expanded contacts.

Another process which is sometimes used to establish good ohmic contact involves evaporating a tin-arsenic alloy onto the oxide layer in which openings have been cut over the base regions and then alloying the tin-arensic without further processing. The molten tin-arsenic alloy does not penetrate the oxide mask, but does "ball up" and wet the germanium substrate where exposed through the openings in the oxide mask, and leave a heavily doped recrystallization region. The excess tin-arsenic alloy can be removed in acid to leave only the heavily doped recrystallized region formed where the substrate was exposed through the oxide layer. A metallized film is then deposited over the substrate and patterned to form expanded contact tabs which extend through the cuts and make good ohmic contact with the recrystallized regions.

Although the prior methods produce suitable semiconductor devices, they are complex procedures which require considerable time and special equipment. This invention is concerned with an improved process for making good ohmic contact with a germanium, silicon, or other semiconductor substrate which is fast, simple and much more economical both with respect to processing time and the equipment required. The process eliminates the need for evaporation equipment and reduces the necessary use of photomask equipment, and several processing steps are eliminated without the addition of any extra steps of significance in the fabrication of a transistor. As a result of the elimination of processing steps, breakage due to handling is reduced. Higher yields have been attained and aluminum expanded contacts can be used without fear that the melting point will be lowered by traces of tin-arsenic which produce difficulties during header mounting, or without fear of increasing the base resistance at bake-out temperatures by reaction with silver-gold-antimony. Further, the invention is adaptable to thin epitaxial collector layer devices because alloying, which tends to reduce the collector-base breakdown voltage by penetrating the base diffusion in a random uncontrolled manner, is avoided.

In accordance with this invention, a metallized film is deposited by an electroless deposition process only on the areas of the semiconductor substrate exposed through openings cut in an oxide layer. The process is chosen such that the surface molecules of the substrate are replaced by metal molecules to form a metallized film in good ohmic contact with the substrate, but at the same time is selected so as not to react with the oxide or other masking film. This eliminates that need to subsequently pattern the metallized film deposited by the electroless process since the metallized film is deposited only in the openings cut in the oxide film. A second metallized film, such as aluminum, is then evaporatively deposited over the entire substrate, including the electrolessly deposited film in the cuts, and patterned to form expanded contacts which are in good ohmic contact with the active base region through the electrolessly deposited film.

In accordance with a more specific aspect of the invention, either palladium or platinum is electrolessly deposited from a dilute, slightly acidic, halide solution. For example, a solution of palladium chloride which has been adjusted to a pH value of approximately 2 with hydrochloric acid, allowed to become saturated at room temperature, diluted to a ratio of about 100 to 1 to about 300 to 1 and readjusted by the addition of hydrochloric acid to a pH of between 1 and 2 can be used to chemically plate palladium on the exposed surface fo germanium. The reaction is rapid and a metal film of sufficient thickness is attained by immersing the germanium slice in the solution for from about 5 to about 15 seconds. The palladium is then thoroughly cleaned and baked in a reducing atmosphere for from about one-half to about three hours at a temperature of from about 400° to about 350° C., the period depending upon the temperature, to further decrease the resistance of the contact.

Figure 2:
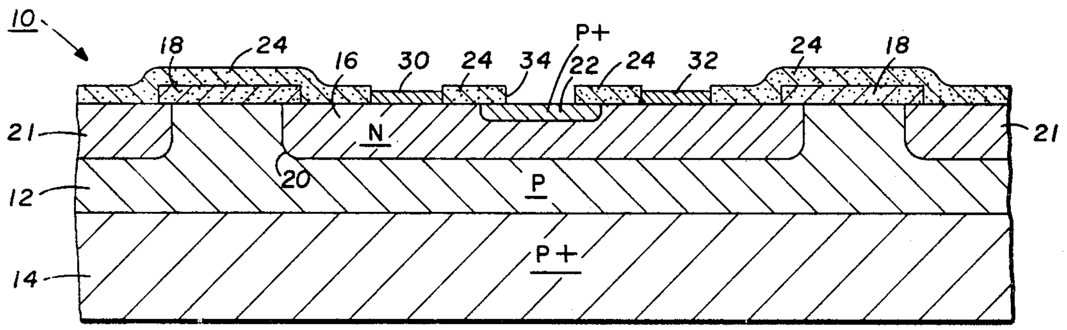
Figure 3:
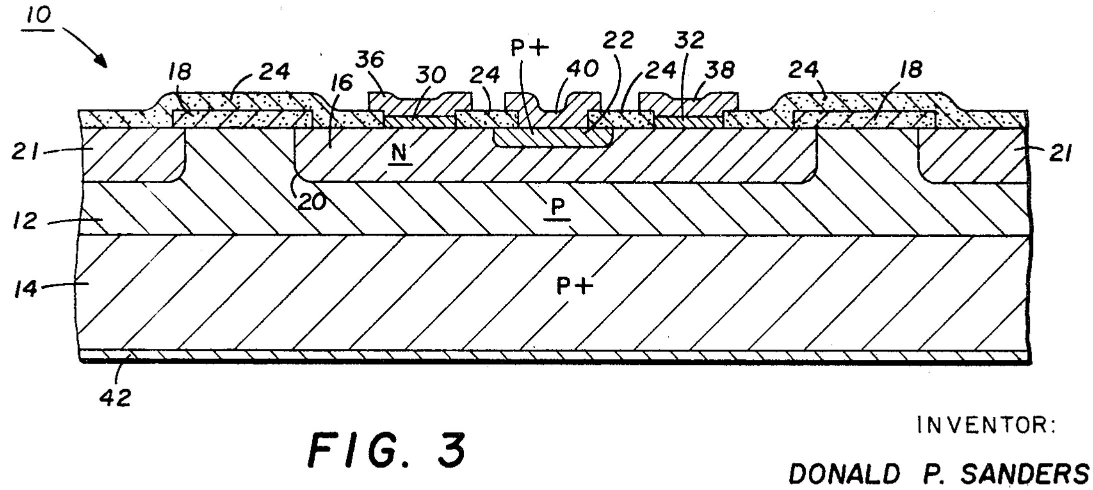

The novel features believed characteristic of this invention are set forth in the appended claims. The invention itself, however, as well as other objects and advantages thereof, will best be understood by reference to the following detailed description of illustrative embodiments when read in conjunction with the accompanying drawings, wherein:

FIGS. 1–3 are schematic cross-sectional views of a transistor in various stages of fabrication which serve to illustrate the process and product of this invention.

Now describing a specific embodiment of the invention in detail, a typical germanium transistor device at an intermediate stage of fabrication is indicated generally by the reference numeral 10 in FIG. 1. A germanium substrate is comprised of a relatively lightly doped P-type germanium region 12 having a resistivity suitable for the collector region of the transistor, and a more heavily doped P-type region 14 which serves as a low resistivity contact region to which a metallized film will make ohmic contact. An N-type base region 16 has been diffused into the P-type collector region 12 through a masking frame 18 patterned from deposited silicon oxide to form a collector base junction 20. At the same time, a diffused N-type region 21 is formed around the outer periphery of the masking frame 18, but is of no consequence in the operation of the transistor device. A more heavily doped P-type emitter region 22 is then formed by an alloy process. As illustrated, the excess material from the alloy process has been removed as by etching, although the presence or absence of the excess metal is of no consequence in the present invention. A second silicon oxide film 24 is then deposited over the entire surface of the substrate and is patterned by conventional photolithographic techniques to open base contact windows 26 and 28.

Next, metal films 30 and 32 are selectively deposited by an electroless plating process only on the surface of the base region 16 that is exposed through the openings 26 and 28. This is accomplished by an electroless plating solution comprised of a dilute acidic metal halide solution. For example, a palladium chloride ($PdCl_2$) solution may be prepared by adjusting the pH value of the solution to approximately 2 with hydrochloric acid and allowing the solution to become saturated at room temperature, then diluting the saturated solution with from about 100 parts to about 300 parts of water per part of the saturated solution and readjusting the pH of the diluted solution to between 1 and 2 with hydrochloric acid. The substrate is merely dipped into the dilute solution at room temperature and brown metallic palladium films 30 and 32 are deposited on the surface of the germanium substrate that is exposed through the openings cut in the oxide layer. The grain size of the palladium film is so small that it cannot be distinguished at 800× magnification. Since the palladium film is formed on the germanium surface due to chemical substitution of palladium for germanium, there is no tendency for the palladium to plate out on the oxide. The substrate is then thoroughly rinsed in deionized water to quench the plating reaction and remove excess plating solutions, and is dried by dipping the substrate successively in pure acetone, then pure trichlorethylene, the remainder of which is evaporated under a dry nitrogen stream.

Next, the substrate is preferably baked in hydrogen, or forming gas, at a temperature substantially below the alloying temperature to decrease the electrical resistance between the palladium films and the base region. It has been found that a baking period of one-half hour at 400° C., or one and one-half to three hours at 370° C. is adequate. The reason for the decrease in the resistance of the base contact as a result of baking is not fully understood although it is speculated that either the palladium film tends to sinter slightly, or the arsenic or other doping impurities may tend to concentrate at the surface of the base region to give a more heavily doped surface, either of which would tend to reduce the resistance. An important advantage of the process is that the baking step may be carried out at the same time, and at the same temperature of course, as the baking steps customarily used to improve the electrical properties of the transistor.

Next, a layer of photo-resist material is formed over the substrate, exposed and developed to open up a window over the emitter region 22. The photo-resist protects the metal films 30 and 32 while the silicon oxide layer 24 is etched to open the window 34 and expose the emitter region 22 as illustrated in FIG. 2. A metallized film, such as aluminum, is then evaporatively deposited over the substrate, including over the metal films 30 and 32 in the base cuts through the oxide and over the exposed emitter region 22 and is patterned by conventional photolithographic techniques to form expanded base contacts 36 and 38 and an expanded emitter contact 40. A metallized film 42, such as gold-gallium, is also deposited over the opposite side of the substrate to serve as a collector contact.

The palladium does not appear to dope N-type germanium detrimentally at any of the processing temperatures encountered in the manufacture of transistors after the application of the contacts. It is also advantageous that the contacts be baked at 370° C., which is well below the melting point of the aluminum alloy emitter material used in many transistors, in order to prevent any detrimental reaction between the emitter alloy material and the oxide.

In its broader aspects, the invention is not limited to the electroless plating on germanium, but is equally applicable to the selective plating on silicon with appropriate plating solutions. For example, palladium may be plated on silicon using the same solution heretofore described provided a small amount of hydrofluoric acid (HF) is added to the solution to cut through the thin oxide film that always forms on silicon when it is exposed. The quantity of HF required may merely be that required to readjust the pH of the solution after it is diluted.

Further, platinum and most other Group VIII metals, except nickel, iron and cobalt, as well as silver, gold and some other metals may be plated on semiconductor materials, although gold and silver would normally be desirable on silicon rather than on germanium. By the selective electroless deposition of a metallized film only upon the substrate and not upon the oxide film, the need for evaporation equipment and photolithographic equipment and solutions is eliminated. A number of process steps are eliminated with only the added step of dipping the substrate for a few seconds into the plating solution, and rinsing and drying the substrate, all of which requires an absolute minimum of equipment and can be accomplished in a relatively short period of time. If desired, the opening 34 over the emitter may be cut at the same time as the openings 26 and 28 over the base and the palladium deposited over the emitter to eliminate another photolithographic step. The baking step is carried out with the hydrogen bake step already required in the manufacture of germanium transistors. Since a number of handling steps are eliminated, the breakage rate is reduced. Further, when the holes in the oxide are badly undercut by the etching solution, the process described has resulted in a much higher yield than when tin-arsenic alloying was used. Aluminum expanded contacts can be used without fear of traces of tin-arsenic lowering the melting point and causing balling during mounting of the wafer on the header, or without fear of an increase in base resistance at bake out temperatures by reaction with silver-gold-antimony. The process is particularly adaptable to the fabrication of semiconductor devices having very thin base layers because any alloying, which is essentially an uncontrolled process insofar as the depth of alloying is concerned, is avoided.

Although preferred embodiments of the invention have been described in detail, it is to be understood that various changes, substitutions and alterations can be made in the process materials and steps without departing from the spirit and scope of the invention as defined by the appended claims.

What is claimed is:

1. In the fabrication of a semiconductor device, the process steps of:

forming an oxide layer over the surface of a germanium semiconductor substrate and selectively removing a portion of the oxide layer to expose the semiconductor substrate in a predetermined area, subjecting the oxide layer and exposed surface of the substrate to a dilute acidic palladium chloride solution to electrolessly plate a palladium film selectively on the exposed surface of the semiconductor substrate without plating on the oxide layer, baking the substrate in a reducing atmosphere at an elevated temperature to reduce the electrical resistance between the palladium film and the semiconductor substrate, depositing a second metallized film over the surface of the palladium film and the oxide layer, and selectively removing predetermined areas of the second metallized film to leave a conductor strip in electrical contact with the palladium film and therefore with the semiconductor substrate.

2. A method as defined by claim 1 wherein the step of subjecting the oxide layer and exposed surface of the substrate to the palladium chloride solution is carried out at substantially room temperature for a time of five to fifteen seconds.

3. In the fabrication of a semiconductor device, the process steps of:

forming an insulating layer on the surface of a germanium semiconductor substrate and selectively removing a portion of the insulating layer to expose the semiconductor substrate in a predetermined area;

electrolessly plating a metallic film consisting essentially of palladium on the exposed surface of said substrate by exposing the masked substrate to an aqueous plating solution consisting essentially of a palladium halide dissolved in water and adjusted to a suitable pH.

4. A method as defined by claim 3 wherein said plating step is carried out at substantially room temperature for a time of five to fifteen seconds.

References Cited

UNITED STATES PATENTS

| | | | |
|---|---|---|---|
| 2,865,793 | 12/1958 | Nobel | 117—217 XR |
| 2,995,473 | 8/1961 | Levi | 117—217 XR |
| 3,290,570 | 12/1966 | Cunningham et al. | 317—240 |
| 3,345,210 | 10/1967 | Wilson | 117—212 |

WILLIAM L. JARVIS, Primary Examiner

U.S. Cl. X.R.

29—589; 117—213, 217; 317—234